(12) United States Patent
Kulkarni et al.

(10) Patent No.:  US 12,598,948 B2
(45) Date of Patent:      Apr. 7, 2026

(54) PURGING SPINDLE ARMS TO PREVENT DEPOSITION AND WAFER SLIDING

(71) Applicant: LAM RESEARCH CORPORATION, Fremont, CA (US)

(72) Inventors: Prasanna Kulkarni, Tigard, OR (US); Huatan Qiu, Portland, OR (US); Brian Joseph Williams, Tigard, OR (US); Ted Tan, West Linn, OR (US)

(73) Assignee: LAM RESEARCH CORPORATION, Fremont, CA (US)

( * ) Notice:  Subject to any disclaimer, the term of this patent is extended or adjusted under 35 U.S.C. 154(b) by 951 days.

(21) Appl. No.:  17/784,422

(22) PCT Filed:  Dec. 16, 2020

(86) PCT No.:  PCT/US2020/065233
§ 371 (c)(1),
(2) Date:  Jun. 10, 2022

(87) PCT Pub. No.:  WO2021/126919

PCT Pub. Date: Jun. 24, 2021

(65)                Prior Publication Data

US 2023/0005776 A1      Jan. 5, 2023

Related U.S. Application Data

(60) Provisional application No. 62/949,205, filed on Dec. 17, 2019.

(51) Int. Cl.
H01L 21/677        (2006.01)
H01J 37/32         (2006.01)
(Continued)

(52) U.S. Cl.
CPC .. H01L 21/67784 (2013.01); H01J 37/32862 (2013.01); H01L 21/6719 (2013.01);
(Continued)

(58) Field of Classification Search
CPC ........... H01L 21/67784; H01L 21/6719; H01L 21/67703; H01L 21/68742;
(Continued)

(56)                References Cited

U.S. PATENT DOCUMENTS 6,319,553 B1 * 11/2001  McInerney  ......... C23C 16/4412
                                                                   427/337
2005/0150452 A1     7/2005  Sen et al.
(Continued)

FOREIGN PATENT DOCUMENTS

JP          H11163075 A      6/1999
JP          2010182747 A     8/2010
(Continued)

OTHER PUBLICATIONS

Japanese Office Action for Japanese Application No. 2022-535449 dated Sep. 25, 2024.
(Continued)

*Primary Examiner* — Aiden Lee

(57)                ABSTRACT

A system includes a plurality of spindle arms located above a plurality of stations in a processing chamber to transport a semiconductor substrate between the stations. The spindle arms reside in the processing chamber during processing of the semiconductor substrate. The system comprises first gas lines arranged below the stations to supply a purge gas. The system comprises second gas lines extending upwards from the first gas lines to supply the purge gas to the spindle arms during the processing of the semiconductor substrate in the processing chamber.

19 Claims, 16 Drawing Sheets

(51) Int. Cl.
*H01L 21/67* (2006.01)
*H01L 21/687* (2006.01)

(52) U.S. Cl.
CPC .. *H01L 21/67703* (2013.01); *H01L 21/68742*
(2013.01); *H01L 21/68771* (2013.01)

(58) Field of Classification Search
CPC ......... H01L 21/68771; H01L 21/67017; H01L
21/67748; H01L 21/68707; H01J
37/32862
See application file for complete search history.

(56) References Cited

U.S. PATENT DOCUMENTS

| | | | |
|---|---|---|---|
| 2015/0017812 A1 | 1/2015 | Chandrasekharan et al. | |
| 2015/0132930 A1* | 5/2015 | Watanabe | H01L 21/22 438/795 |
| 2016/0307782 A1* | 10/2016 | Weaver | H01L 21/67742 |
| 2017/0032982 A1 | 2/2017 | Drewery et al. | |
| 2017/0316988 A1* | 11/2017 | Kang | H01L 21/02164 |
| 2018/0122633 A1 | 5/2018 | Leeser | |
| 2021/0181638 A1* | 6/2021 | Yamauchi | B05B 9/002 |

FOREIGN PATENT DOCUMENTS

| | | | | | |
|---|---|---|---|---|---|
| JP | 2010283211 A | 12/2010 | | | |
| JP | 2011099156 A | 5/2011 | | | |
| JP | 2016139795 A | 8/2016 | | | |
| JP | 2018026547 A | 2/2018 | | | |
| JP | 2018107392 A | 7/2018 | | | |
| JP | 2019062091 A | 4/2019 | | | |
| JP | 7636415 B2 | * | 2/2025 | ....... | H01L 21/67703 |
| KR | 100871020 B1 | 11/2008 | | | |
| KR | 20170015176 A | 2/2017 | | | |
| KR | 1020190074481 A | 6/2019 | | | |
| WO | WO-2008079449 A2 | 7/2008 | | | |

OTHER PUBLICATIONS

Korean Office Action for Korean Application No. 10-2022-7024547 dated Nov. 22, 2024.

International Search Report and Written Opinion of the ISA issued in PCT/US2020/065233, mailed Apr. 21, 2021; ISA/KR.

* cited by examiner

208

282

284

286

286

280

290

298

292

296

295

294

Detail C

Detail D

See Detail D

Section G-G

See Detail C

208

Detail Item 5

230

290

290

230

See Detail 5

290

230

208

Section A-A

See Detail B

Section C-C

Detail B

Section D-D

PURGING SPINDLE ARMS TO PREVENT DEPOSITION AND WAFER SLIDING

CROSS-REFERENCE TO RELATED APPLICATIONS

The present disclosure is a U.S. National Phase Application under 35 U.S.C. 371 of International Application No. PCT/US2020/065233, filed on Dec. 16, 2020, which claims the benefit of U.S. Provisional Application No. 62/949,205 filed on Dec. 17, 2019. The entire disclosures of the application referenced above are incorporated herein by reference.

FIELD

The present disclosure relates generally to substrate processing systems and more particularly to a purging system to prevent deposition on spindle arms in processing chambers of the substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

A system comprises a plurality of spindle arms located above a plurality of stations in a processing chamber to transport a semiconductor substrate between the stations. The spindle arms reside in the processing chamber during processing of the semiconductor substrate. The system comprises first gas lines arranged below the stations to supply a purge gas. The system comprises second gas lines extending upwards from the first gas lines to supply the purge gas to the spindle arms during the processing of the semiconductor substrate in the processing chamber.

In another feature, the system further comprises a channel arranged near a top portion of each of the stations. The channel is in fluid communication with one of the second gas lines and includes an outlet to supply the purge gas to one of the spindle arms.

In another feature, the system further comprises a connecting assembly to sealingly connect the channel to the one of the second gas lines.

In another feature, the connecting assembly comprises an orifice to control flow of the purge gas into the channel.

In another feature, the system further comprises a channel arranged near a top portion of each of the stations. The channel is in fluid communication with one of the second gas lines and includes an outlet near each end of the channel to supply the purge gas to two of the spindle arms located on either side of the channel.

In another feature, the system further comprises a liner lining the top portion of each of the stations. The liner comprises the channel.

In another feature, the second gas lines are arranged around the stations.

In another feature, the system further comprises a source supplying the purge gas to the first gas lines via a regulator regulating a flow rate of the purge gas to the first gas lines.

In another feature, the system further comprises a controller to control a process being performed on the semiconductor substrate, to control the spindle arms during the process to transfer the semiconductor substrate between the stations, and to control a flow rate of the purge gas being supplied to the first gas lines.

In another feature, the system further comprises a spindle located at a center of the processing chamber to move the spindle arms laterally across the stations arranged around the center.

In still other features, a system comprises a plurality of gas lines arranged in a plane around base portions of N stations, where N is an integer greater than 2. The N stations are arranged around a center of a processing chamber for processing a semiconductor substrate. The system comprises N liners lining circumferences of top portions of the N stations, respectively. Each of the N liners extend from the circumference outwardly parallel to the plane and include a channel in fluid communication with the plurality of gas lines. The channel is arranged along the circumference, has closed first and second ends proximate to the center of the processing chamber, and includes an outlet at each of the first and second ends to dispense a gas laterally away from the circumference. The system comprises N spindle arms to transfer the semiconductor substrate between the N stations. Each of the N spindle arms extends laterally from a spindle at the center of the processing chamber parallel to the plane, is disposed between two adjacent ones of the N liners, and includes areas that contact the semiconductor substrate during the transfer. The areas are proximate to the outlets of the channels of the two adjacent ones of the N liners. The system comprises N vertical gas lines arranged in peripheries of the N stations, respectively. Each of the N vertical gas lines is in fluid communication with the plurality of gas lines and with the channels of the N liners, respectively.

In other features, each of the N vertical gas lines is sealingly connected to a corresponding channel through an inlet to a corresponding one of the N liners, and the inlet has an orifice in fluid communication with the corresponding channel.

In other features, the inlet includes a connection to a corresponding one of the N vertical gas lines, an O-ring surrounding the orifice of the inlet, the O-ring sealingly connecting the orifice to the corresponding channel, and a plurality of notches to align the inlet with the corresponding one of the N liners.

In other features, each of the channels includes a plurality of the outlets, and the areas of each of the N spindle arms that contact the semiconductor substrate are proximate to the plurality of the outlets of the channels of the corresponding two adjacent ones of the N liners.

In other features, the plurality of gas lines are interconnected using connecting assemblies. Each of the connecting assemblies includes a first portion connected to a first gas line of the plurality of gas lines, a second portion connected to a second gas line of the plurality of gas lines, an O-ring sealingly connecting the first and second portions, and a plurality of vented screws disposed around the O-ring and fastening the first and second portions. The first and second gas lines are in fluid communication through the first and second portions.

In other features, each of the N vertical gas lines is positioned away from a vertical travel path of the semiconductor substrate in each of the N stations.

In other features, the plurality of gas lines is connected to a source of the gas located external to the processing chamber. The system further comprises a pressure regulator arranged external to the processing chamber to regulate a flow rate of the gas being supplied from the source to the plurality of gas lines.

In other features, the outlets of the channels of the N liners output the gas onto the areas of the N spindle arms during processing of the semiconductor substrate.

In other features, the outlets of the channels of the N liners output the gas onto the areas of the N spindle arms, and the gas prevents or reduces deposition of material on the areas of the N spindle arms during processing of the semiconductor substrate.

In other features, the system further comprises a controller to control a process being performed on the semiconductor substrate, to control the N spindle arms during the process to transfer the semiconductor substrate between the N stations, and to control a flow rate of the purge gas being supplied to the plurality of gas lines. The outlets of the channels of the N liners output the gas onto the areas of the N spindle arms to prevent or reduce deposition of material used in the process on the areas of the N spindle arms.

In still other features, a method comprises routing a plurality of gas lines around bottom portions of a plurality of stations of a processing chamber. The stations are arranged around a spindle located at a center of the processing chamber. The spindle has spindle arms residing between upper portions of the stations to transfer a semiconductor substrate between the stations. The method comprises extending, peripherally to each of the stations, a vertical gas line from a portion of the plurality of gas lines to a top portion of each of the stations. The method comprises arranging a channel in a liner aligned with a circumference of the top portion each of the stations. The channel is in fluid communication with the vertical gas line, is semi-circular and closed at both ends proximate to the center of the processing chamber, and includes at the both ends a plurality of outlets for dispensing gas onto adjacent ones of the spindle arms. The method comprises supplying a gas through the plurality of gas lines to the channels during processing of the semiconductor substrate.

In another feature, the method further comprises dispensing the gas from the channels into the spindle arms to prevent or reduce deposition of material on the spindle arms during processing of the semiconductor substrate.

In another feature, the method further comprises controlling a flow rate of the gas being supplied to the plurality of gas lines.

In another feature, the gas includes an inert or a nonreactive gas.

In other features, the method further comprises controlling a process being performed on the semiconductor substrate, controlling the spindle arms during the process to transfer the semiconductor substrate between the stations, controlling a flow rate of the gas being supplied to the plurality of gas lines during the process, and dispensing the gas from the channels onto the spindle arms to prevent or reduce deposition of material used in the process on the spindle arms.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 13 and 14 show various elements or sections of the gas lines and their interconnecting assemblies;

In the drawings, reference numbers may be reused to identify similar and/or identical elements.

DETAILED DESCRIPTION

Figure 1:
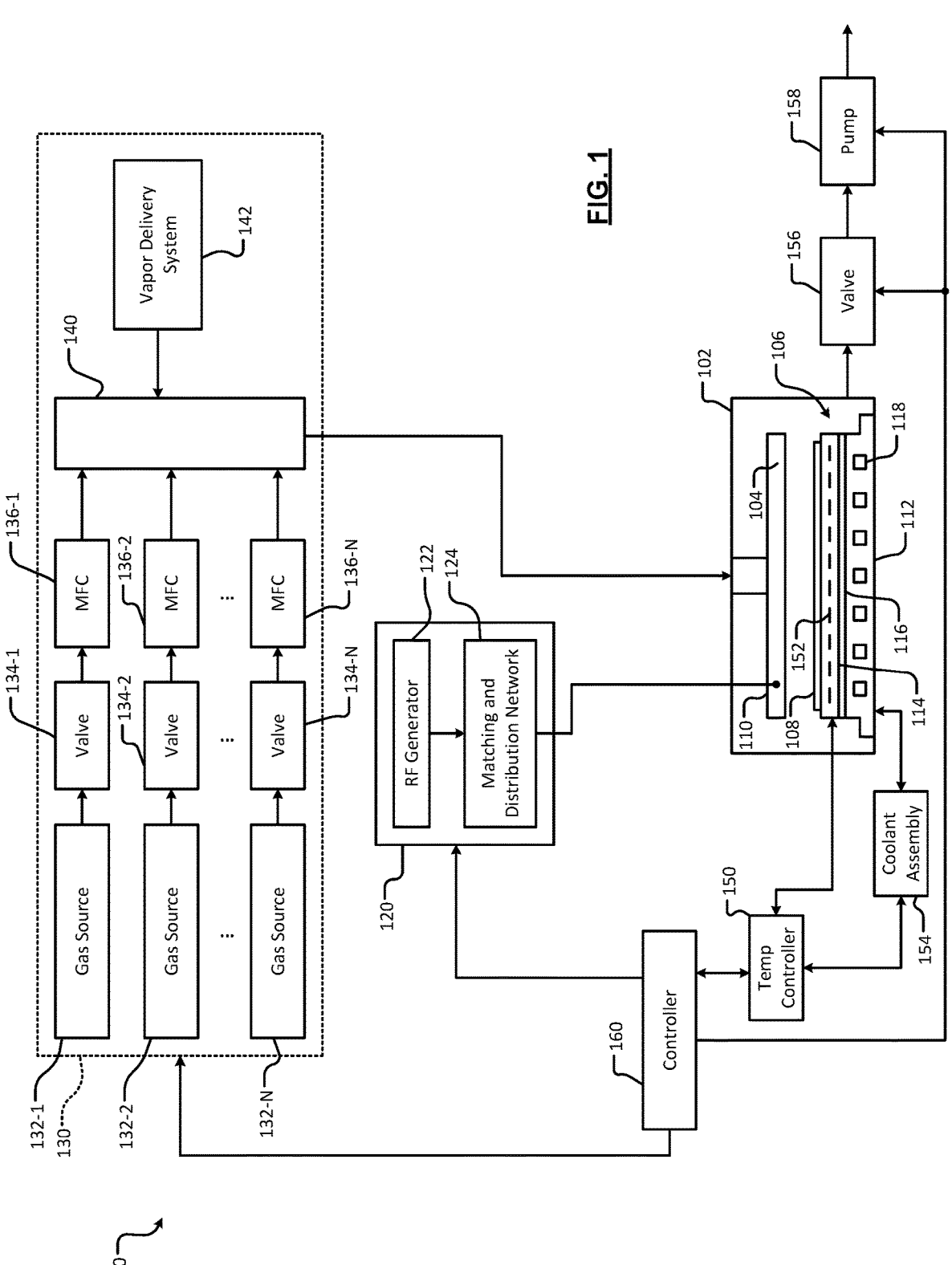
FIG. 1 shows an example of a substrate processing system comprising a processing chamber.

In a ring-less wafer transfer system, spindle arms can be used to transfer wafers between stations in a processing module. The spindle arms that reside in the processing module can accumulate deposition material from deposition processes carried out in the processing module. In a processing module that deposits a slippery film on wafers, a wafer can slip from a spindle arm while being indexed between stations after the spindle arm accumulates the deposition material over a period of time. The accumulation of the deposition material on the spindle arm over time limits the batch size for the processing module, which significantly impacts the throughput. The present disclosure provides a purging system that can generate concentrated purge around points of wafer contact on the spindle arms. The purging system prevents or reduces buildup of the deposition material on the spindle arms and prevent wafer sliding.

The ring-less wafer transfer system comprises spindle arms located between two adjacent stations in the processing module. The spindle arms can move over the pedestal. The lift pins transfer the wafer from the pedestal to the spindle arms. Then the spindle arms can index to move the wafer from one station to another in the processing module. The spindle arms can reside in the processing module. The spindle arms are exposed to the deposition processes performed on the wafers in the processing module. Accordingly, the film being deposited on a wafer can also deposits on the spindle arms during the deposition process. After accumulation of a slippery film on a spindle arm, a wafer being transported by the spindle arm can slide off the spindle arm during indexing. A slipped wafer in most cases can lead to either a broken wafer or a scrapped wafer. Further, recovering the wafer in most cases requires opening the processing module, which causes significant downtime. One way to contain the problem of wafer slippage is to reduce the batch size, which impacts the throughput of the tool.

The present disclosure generally provides a purging system that introduces a purge gas over the contact pads of the spindle arms to prevent deposition on the contact pads of the spindle arms. Alternatively, the purging system can also introduce the purge gas over the entire spindle arms to prevent deposition on the spindle arms. The purging system can reduce or mitigate the risk of wafer sliding. The purging is performed during the deposition process. That is, the purging is performed while the deposition on a wafer is in progress. The purge gas can be any inert gas such. For example, argon can be used as the purge gas.

The purge gas can be brought into the processing chamber through an opening or an inlet in the processing chamber using a custom seal. The flow rate of the purge gas can be regulated using a pressure regulator. The inlet to the processing chamber can have an orifice. By controlling pressure and the orifice size, the flow rate of the purge gas into the processing chamber can be controlled.

The purge gas can be equally distributed to the stations in the processing chamber using a network of gas lines inside the processing chamber. The gas lines can be connected to each other using interconnecting assemblies with custom designed seals. The purge gas can then flow into liners/filler plates surrounding each station. An inlet to a liner can have an orifice to equally distribute the gas between the stations of the processing chamber. The liners can have an internal channel within them that takes in the purge gas from one inlet and channels the purge gas to four outlets (called purge orifices) that are concentrated around the points of wafer contact on the spindle arms. For example, the gas lines and the liners can be made of aluminum. The liners are manufactured using, for example, friction stir welding process.

Notably, the purge system can be independent of the recipes and chemistries used for wafer deposition. That is, the purging process using the purge gas can prevents or reduces deposition on the spindle arms regardless of the recipes and chemistries used for depositing material on wafers. Further, the purging process prevent or reduce deposition on the spindle arms regardless of the pressure and temperature used in the processing chamber during wafer deposition. The purging process can be carried out during wafer deposition. For example, the gas lines run below the lift pin ring in each station. Thus, the gas lines do not interfere with the movements of the lift pins.

The present disclosure is organized as follows. Initially, an example of a processing chamber is shown and described with reference to FIG. 1. Subsequently, various layouts and structures of the purging system according to the present disclosure are shown and described with reference to FIGS. 2-9. Thereafter, additional views and structural details of various elements of the purging system are shown and described with reference to FIGS. 10-17. A method for purging the spindle arms during wafer processing is shown and described with reference to FIG. 18.

FIG. 1 shows an example of a substrate processing system 100 comprising a processing chamber 102. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 100 comprises the processing chamber 102 that encloses other components of the system 100 and contains an RF plasma (if used). The processing chamber 102 comprises an upper electrode 104 and an electrostatic chuck (ESC) 106 or other substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, or purge gas flows. Alternately, the upper electrode 104 may include a conducting plate, and the process gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example only, the RF generating system 120 may include an RF generator 122 that generates RF power that is fed by a matching and distribution network 124 to the upper electrode 104 or the baseplate 112. In other examples, the plasma may be generated inductively or remotely.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102. A system controller 160 controls the components of the system 100.

Lift pins are retained by lift pin holders arranged on a lift pin ring (shown and described with reference to FIG. 3 below) and are used to allow delivery and removal of the substrate 108 from the processing chamber 102 using a robot arm (e.g., a spindle arm described below). Normally, an upper end of the lift pins is located flush with or below an upper surface of the substrate support assembly 106. During substrate delivery or removal, the lift pins are raised relative to an upper surface of the substrate support assembly 106 to lift the substrate 108 and provide clearance between the substrate 108 and the substrate support assembly 106. The clearance between the substrate 108 and the substrate support assembly 106 allows an end effector of the robot arm to be inserted or removed.

Figure 2:
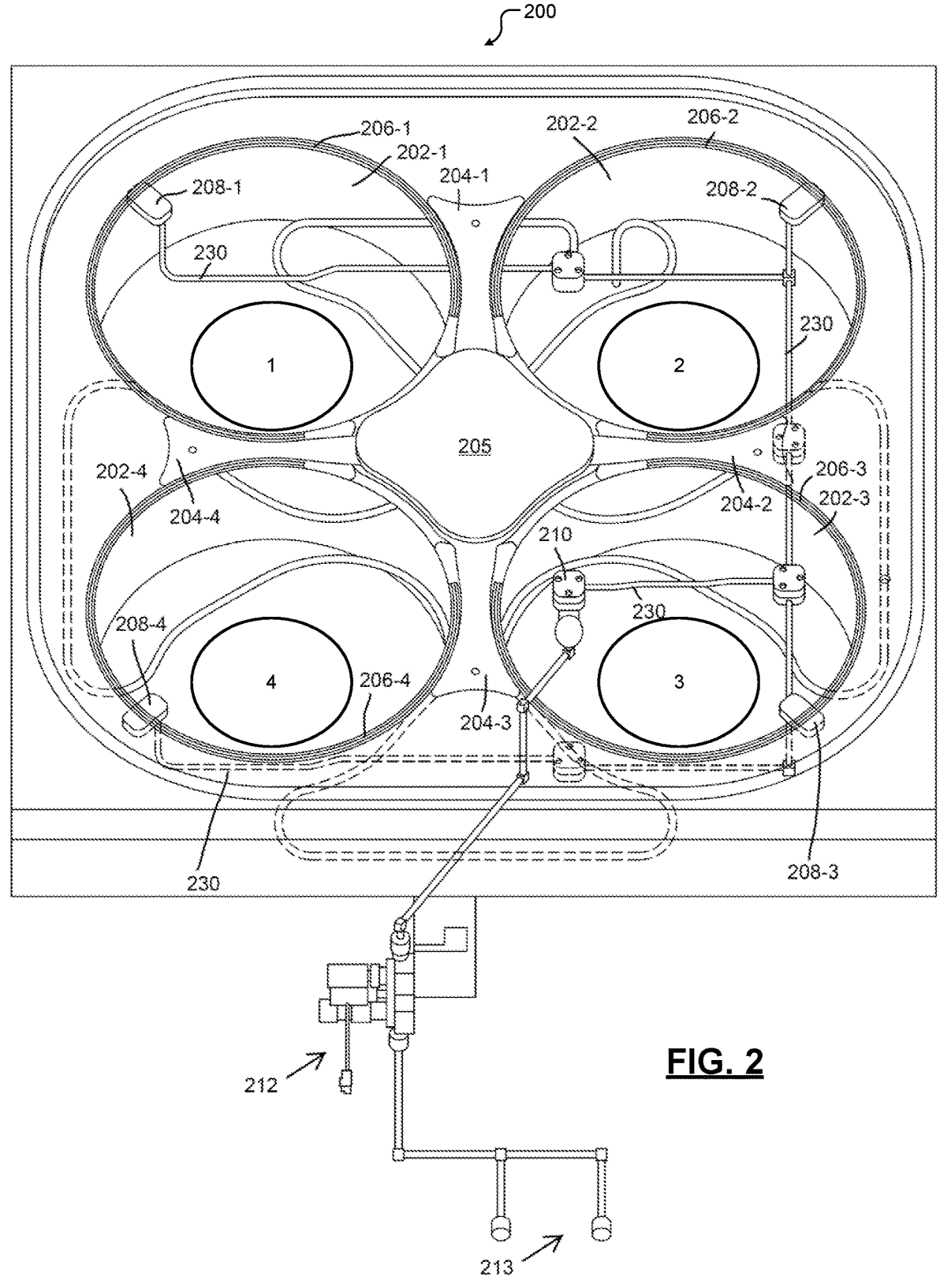
FIG. 2 shows an example of a processing chamber including a plurality of stations.

FIG. 2 shows an example of a processing chamber 200 including a plurality of stations. For example, the processing chamber 200 includes four stations 202-1, 202-2, 202-3, and 202-4 (collectively the plurality of stations 202; or synonymously, the stations 202). In general, the processing chamber 200 may include two or more stations 202. The processing chamber 200 includes a plurality of spindle arms. For example, since the processing chamber 200 includes four stations 202, the processing chamber 200 includes four spindle arms 204-1, 204-2, 204-3, and 204-4 (collectively the plurality of spindle arms 204; or synonymously, the spindle arms 204). A spindle 205 drives the spindle arms 204. A controller (e.g., the controller 160 shown in FIG. 1) controls the spindle 205 and the spindle arms 204.

Each station 202 includes a liner that lines an upper circumference of the station 202 along a plane that is parallel to a plane in which a wafer lies in the station 202 during processing. For example, since the processing chamber 200 includes four stations 202, the processing chamber 200 includes four liners 206-1, 206-2, 206-3, and 206-4 (collectively liners 206). Each liner 206 includes a channel (shown as element 207 in FIG. 12) for gas flow. Each liner 206 includes an inlet that is in fluid communication with the channel for receiving the purge gas. The liner 206, also called a filler plate, is shown in detail in FIGS. 10-12.

Each station 202 includes an inlet with an orifice that is in fluid communication with the inlet of the liner 206 and that feeds the purge gas into the liner 206 (i.e., into the channel of the liner 206). For example, the stations 202 include inlets 208-1, 208-2, 208-3, and 208-4 (collectively inlets 208) that respectively feed the purge gas into the liners 206. The inlet 208 is shown in detail in FIGS. 8 and 16.

Figure 12:
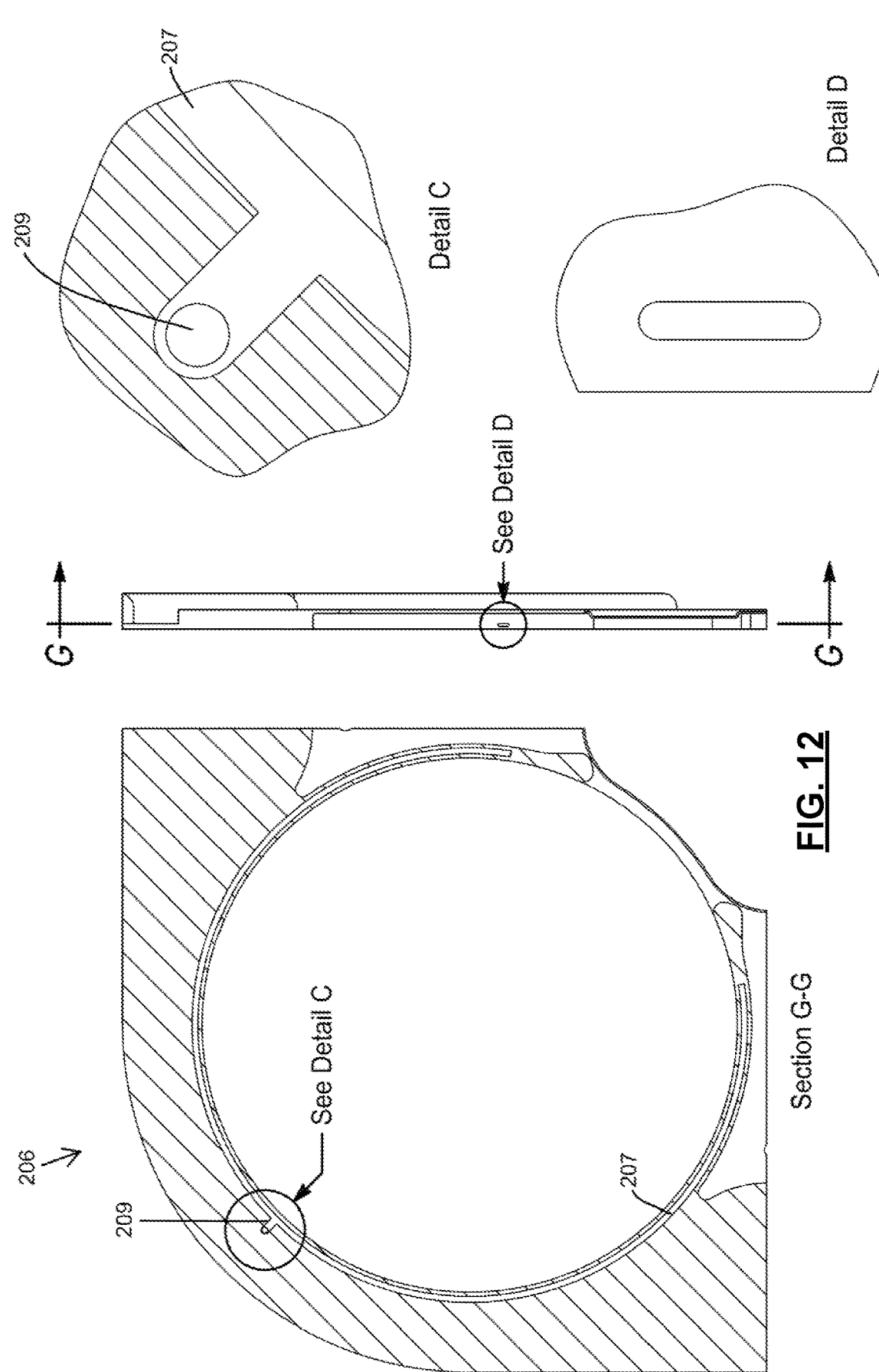
FIG. 12 shows a channel in one of the liners, which is used to dispense a purge gas onto the spindle arms to prevent buildup of deposition material on the spindle arms.

The channel in each liner 206 services two spindle arms 204. The channel is embedded in the liner 206 as shown in FIG. 12. The channel is shown as element 207 in FIG. 12. Accordingly, it can also be said that each channel services two spindle arms 204. The terms channel and liner can be used interchangeably when describing delivery of the purge gas through the liners 206 to the spindle arms 204.

The channel in each liner 206 is semi-circular, closed at both ends, and has four outlets (shown in detail in FIGS. 4 and 6) that deliver the purge gas to two spindle arms 204. The channel in each liner 206 includes two halves: a first half extending from the inlet (or from the inlet 208) to a first end of the liner 206 (or of the channel), and a second half extending from the inlet (or from the inlet 208) to a second end of the liner 206 (or of the channel).

In each liner 206 (i.e., in each channel), a first set of two outlets is located on the first half of the liner 206 (or of the channel) that is on the first side of the inlet 208, and a second set of two outlets is located on the second half of the liner 106 (or of the channel) that is on a second side of the inlet 208. Each of the first and second sets of outlets can include one outlet or a plurality of outlets.

In each liner 206 (i.e., in each channel), the first set of two outlets located on the first half of the liner 206 outputs the purge gas to one side of a first spindle arm 204 that is adjacent to the first half of the liner 206. In each liner 206 (i.e., in each channel), the second set of two outlets located on the second half of the liner 206 outputs the purge gas to one side of a second spindle arm 204 that is adjacent to the second half of the liner 206.

For example, in the liner 206-1, a first set of two outlets outputs the purge gas to a first side of the spindle arm 204-1 that is adjacent to a first half of the liner 206-1, and a second set of two outlets outputs the purge gas to a first side of the spindle arm 204-4 that is adjacent to a second half of the liner 206-1.

In the liner 206-2, a first set of two outlets outputs the purge gas to a second side of the spindle arm 204-1 that is adjacent to a first half of the liner 206-2, and a second set of two outlets outputs the purge gas to a first side of the spindle arm 204-2 that is adjacent to a second half of the liner 206-2.

In the liner 206-3, a first set of two outlets outputs the purge gas to a second side of the spindle arm 204-2 that is adjacent to a first half of the liner 206-3, and a second set of two outlets outputs the purge gas to a first side of the spindle arm 204-3 that is adjacent to a second half of the liner 206-3.

In the liner 206-4, a first set of two outlets outputs the purge gas to a second side of the spindle arm 204-3 that is adjacent to a first half of the liner 206-4, and a second set of two outlets outputs the purge gas to a second side of the spindle arm 204-4 that is adjacent to a second half of the liner 206-4.

A plurality of gas lines 230 (shown in detail in FIGS. 6, 7, 13, and 14) are distributed across the bottom region of the stations 202 to distribute the purge gas to the liners 206 (i.e., to the channels in the liners 206). The processing chamber 200 includes an inlet 210 through which the gas lines 230 receive the purge gas from an external source of the purge gas. The inlet 210 is sealed at the bottom wall of the processing chamber 200 using a custom seal. The inlet 210 is connected to a source of the purge gas (e.g., one or more of the elements 132 shown in FIG. 1) that is located external to the processing chamber 200.

The inlet 210 is connected to the source of the purge gas through a valve and a pressure regulator collectively shown at 212. The elements 212 are connected to the source of the purge gas through one or more selectable connections. For example, two such selectable connections, which may be used for selecting different purge gases (e.g., argon or other nonreactive gases), are shown generally at 213. The valve and the pressure regulator can be used to control the flow rate of the purge gas into the gas lines 230 through the inlet 210. Alternatively, a mass flow controller (MFC) such as element 136 shown in FIG. 1 can be used to control the flow rate instead of using the valve, the pressure regulator, and the inlet 212.

In the example shown in FIG. 2, the stations 202 are also numbered 1 through 4. The inlet 210 is shown as being located under station 3 for example only. Alternatively, the inlet 210 can be located under any other station, or the inlet 210 can be any aperture/hole anywhere in the processing chamber 200. Further, for example only, the connections or routing of the gas lines 230 is shown as being from station 3 to station 4 and from station 3 to station 2 to station 1. In the example shown in FIG. 2, for example only, the gas lines 230 originate from the inlet 210 at station 3 and terminate at station 4; and the gas lines 230 originate at station 3 and terminate at station 1. In other words, in the example shown in FIG. 2, for example only, the gas lines 230 include two branches extending from the inlet 210 and station 3: a first branch extending from station 3 to station 4, and a second branch extending from station 3 to station 1.

Figure 5:
FIG. 5 shows another example of a processing chamber including a plurality of stations.

However, the connections or routing of the gas lines 230 can be different than that shown in FIG. 2. For example, FIG. 5 shows another example of the connections or routing of the gas lines 230, which is from station 3 to station 2 to station 1 to station 4. Accordingly, the inlet 210 for the gas lines 230 into the processing chamber 200 can be located under any of the stations 202, and the manner in which the gas lines 230 are connected or routed between the stations 202 is variable. For example, the gas lines 230 can be connected or routed to the stations 202 in a sequence or in one or more branches. Thus, the design or distribution of the gas lines 230 is modular and flexible.

Figures 3, 4:
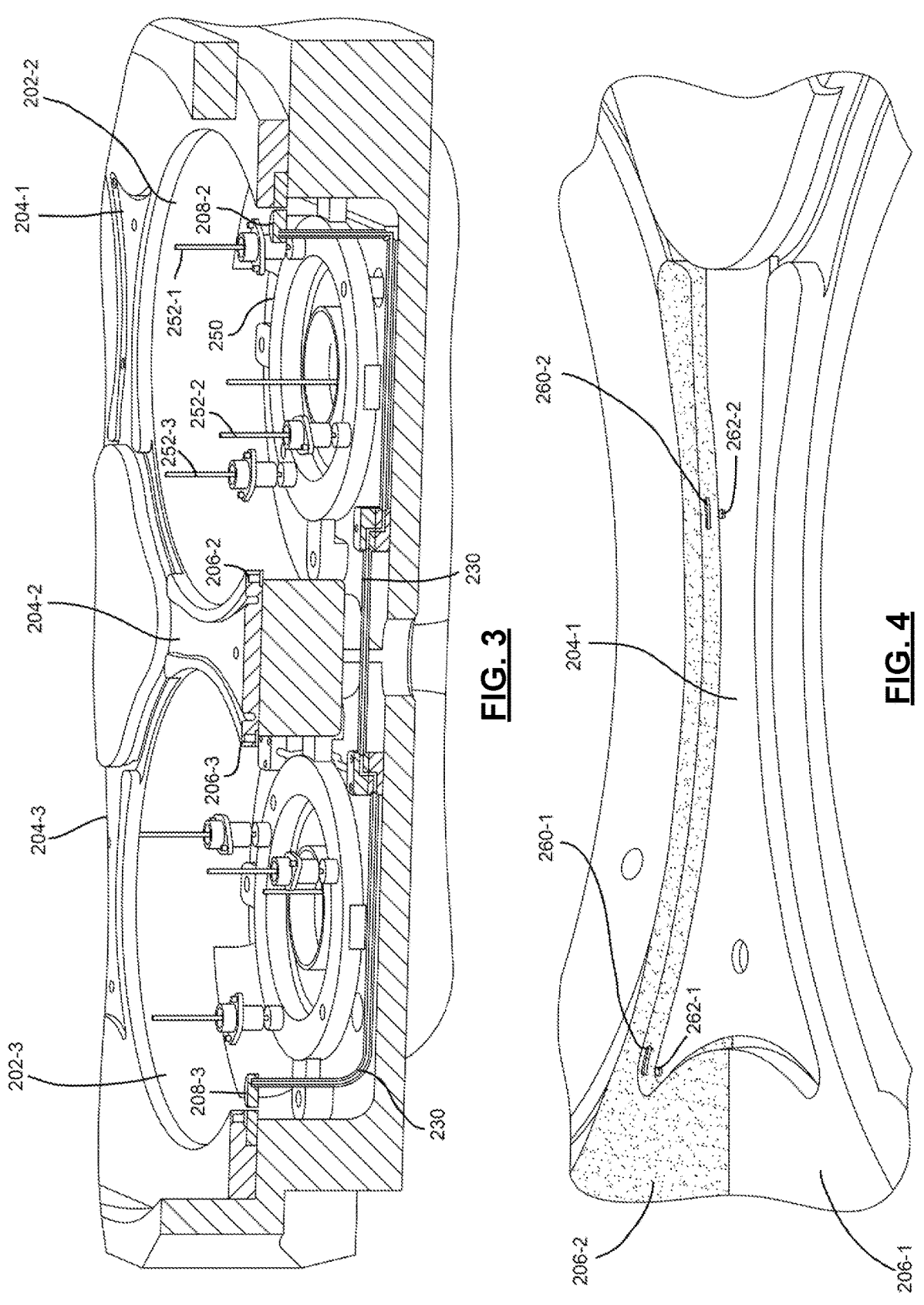
FIG. 3 shows a cross-sectional view of the processing chamber of FIG. 2.
FIG. 4 shows a spindle arm used to transfer substrates between the stations of FIG. 2.

FIG. 3 shows a cross-sectional view of the processing chamber 200 and shows additional details of the stations 202. Each station 202 includes a lift pin ring and three lift pins. For example, the station 202-2 includes a lift pin ring 250 and three lift pins 252-1, 252-2, and 252-3 (collectively lift pins 252). While the lift pin ring 250 and the lift pins 252 are identified in only one station 202-2, it is understood that each station 202 includes a lift pin ring similar to the lift pin ring 250 and lift pins similar to the lift pins 252. The gas lines 230 (shown in detail in FIGS. 6 and 7) are distributed across the bottom region of the stations 202 in a plane parallel to and below the plane of the lift pin rings 250, which is parallel to the plane in which the wafer lies in each of the stations 202 during processing.

FIG. 4 shows the spindle arm 204 in further detail. For example only, the spindle arm 204-1 is shown. It is understood that each spindle arm 204 includes elements similar to those shown and described with reference to the spindle arm 204-1. The liners 206-2 and 206-1 deliver the purge gas to the spindle arm 204-1. Two of the four outlets (also called purge orifices) of the liner 206-2 that supply the purge gas to the spindle arm 204-1 are identified as elements 260-1 and 260-2. Two additional outlets of the four outlets (also called purge orifices) of the liner 206-1 that supply the purge gas to the spindle arm 204-1 are not visible in this view. These outlets 260-1, 260-2, and so on of each liner 206 are collectively called outlets or purge orifices 260.

Each spindle arm 204 includes four contact points that contact the wafer. The number of contact points on a spindle arm can vary. Of the four contact points, only two contact points of spindle arm 204-1 are visible in this view. The two contact points are identified as elements 262-1 and 262-2. As shown, the two outlets 260-1 and 260-2 of the liner 206-2 are located respectively adjacent to the two contact points 262-1 and 262-2 of spindle arm 204-1. Similarly, the two outlets of the liner 206-1, which are not visible in this view, are also located respectively adjacent to the two other contact points of spindle arm 204-1, which are not visible in this view.

Accordingly, four outlets of two liners 206 (e.g., liners 206-1 and 206-2 in the example shown) from two adjacent stations 202 (e.g., stations 202-2 and 202-1 in the example shown) are located adjacent to four contact points of each spindle arm 204. Stated generally, the four outlets or purge orifices 260 of two adjacent liners 206 supply the purge gas to the spindle arm 204 proximate to the four contact points 262 of the spindle arm 204.

FIG. 5 shows a top view of the processing chamber 200 and shows a different example than the example shown in FIG. 2. In this example, the connection or routing of the gas lines 230 is different than in FIG. 2. For example, the gas lines 230 are connected or routed from station 3 to station 2 to station 1 to station 4. In this example, the gas lines 230 originate from the inlet 210 at station 3 and terminate at station 4. In FIG. 5, similar to the example shown in FIG. 2, the gas lines 230 lie in a plane below the plane in which the lift pin rings 250 lie, which is parallel to the plane in which the wafer lies in each station 202 during processing.

Figure 6:
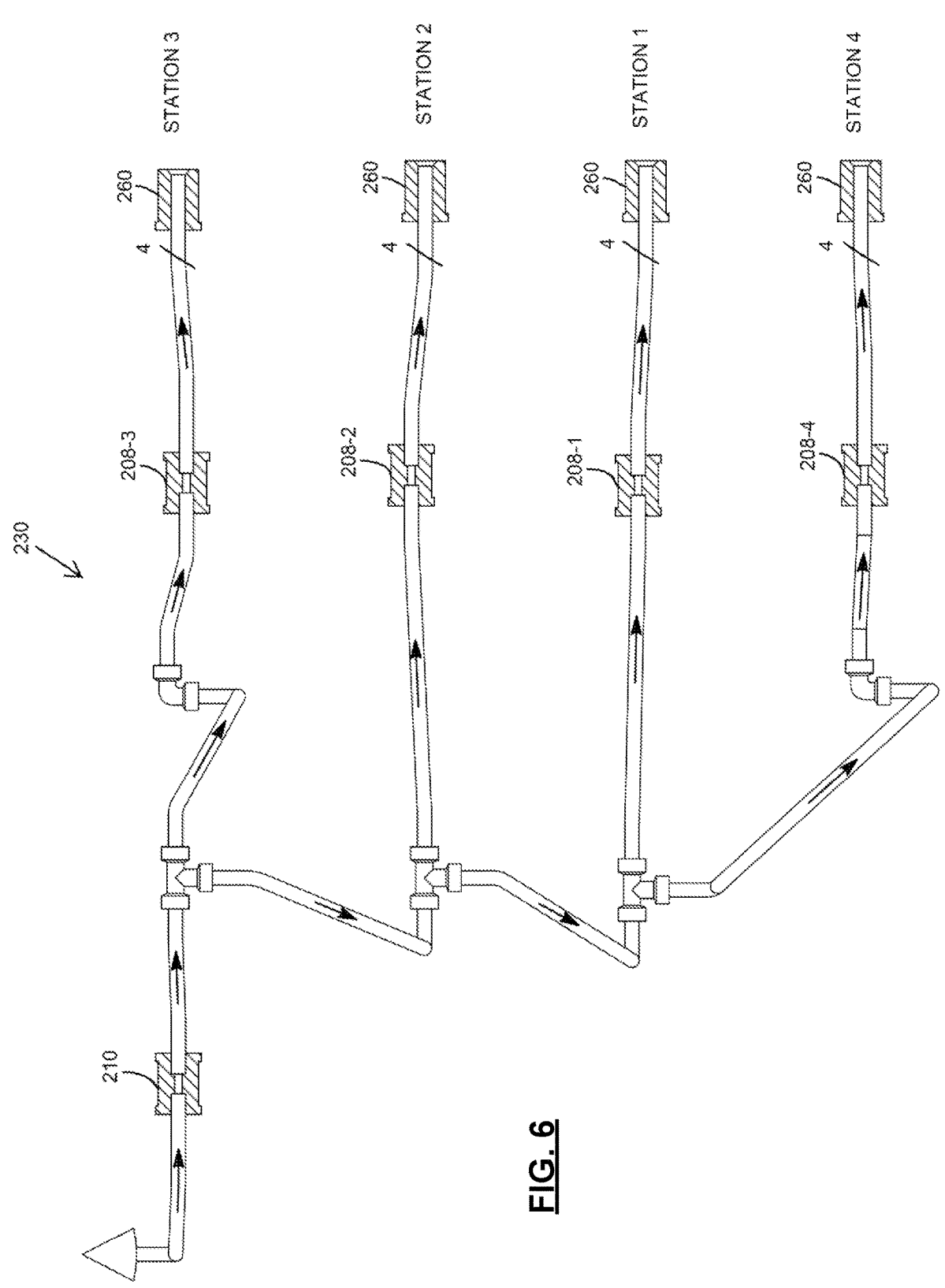
FIG. 6 shows gas lines of a purging system of the present disclosure that can be used in the processing chambers of FIGS. 2 and 5.

FIG. 6 shows the gas lines 230 in detail. For simplicity of illustration, only one outlet 260 is drawn for each station 202. However, for example, an indication shown as "/4" indicates that there are four outlets 260 for each station 202 as described with reference to FIG. 4 above. FIG. 6 shows only one example configuration of the gas lines 230 that corresponds to the connections or routing of the gas lines 230 shown in FIG. 5. Non-limiting examples of other configurations or variations include the following. For example, the inlet 210 may be moved from station 3 to any other station. For example, the branch associated with station 4 can be moved above the branch associated with station 3 (as shown in the example shown in FIG. 2). The examples are not mutually exclusive. That is, both the inlet 210 and a branch associated with a station 202 can be moved to locations different than those shown.

Figure 7:
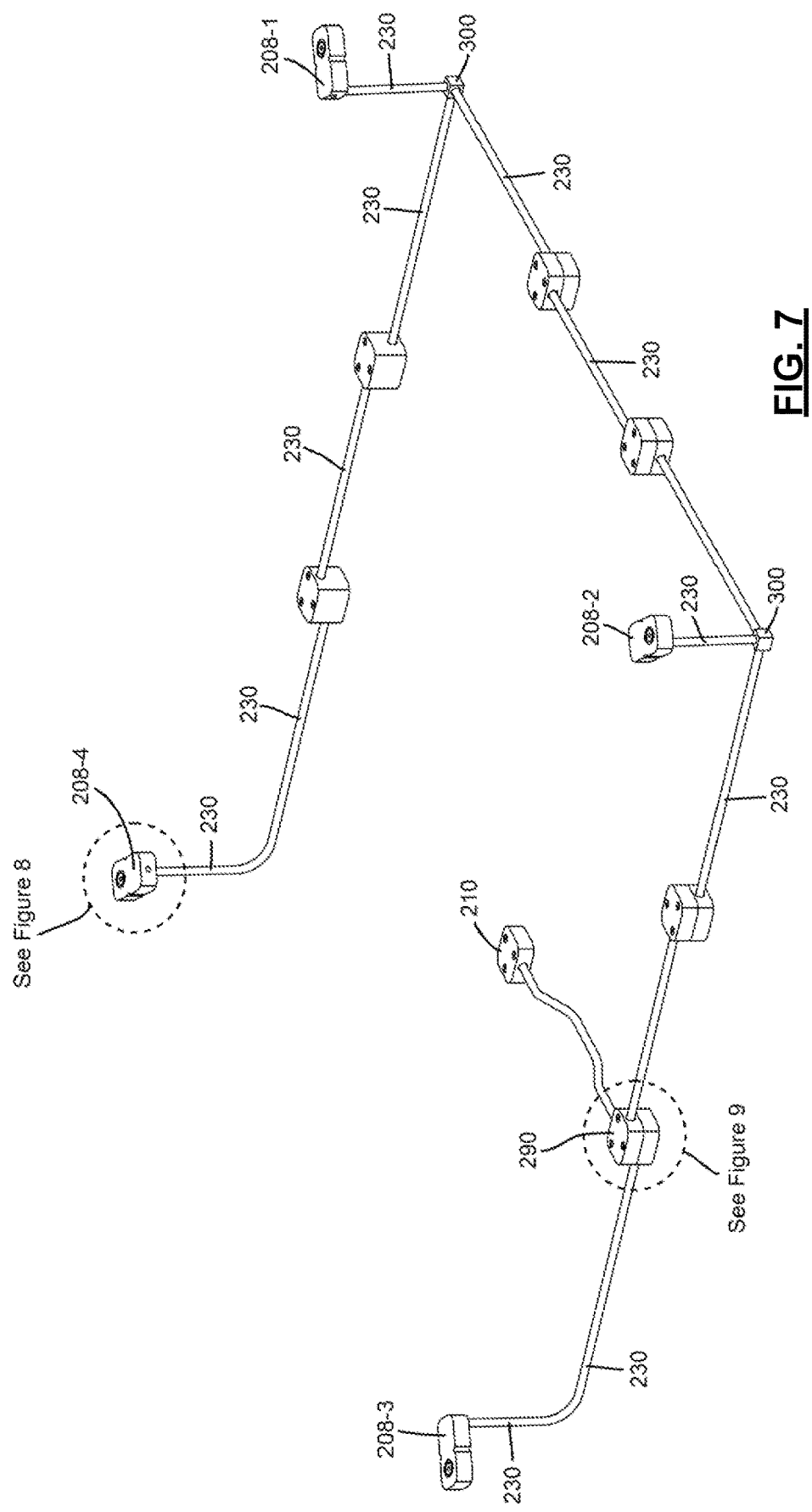
FIG. 7 shows interconnections of the gas lines.

FIG. 7 shows interconnections of the gas lines 230 in detail. Again, FIG. 7 shows only one example configuration of the gas lines 230 that corresponds to the connections or routing of the gas lines 230 shown in FIG. 5. As described with reference to FIG. 6 above, other additional configurations, including the example shown in FIG. 2, are feasible and are contemplated.

As shown, the gas lines 230 are distributed across the stations 202 at and around the bottom regions of the stations 202. The gas lines 230 lie in a plane parallel to the plane in which the lift pin rings 250 and the wafer lie. In each station 202, a portion of the gas lines 230 extends vertically (i.e., perpendicularly to the plane in which the lift pin rings 250 and the wafer lie) and mates (i.e., sealingly connects) with the inlet 208 of the liner 206. The structure of the inlet 208 is shown and described in detail with reference to FIGS. 8 and 16 below.

Figure 17:
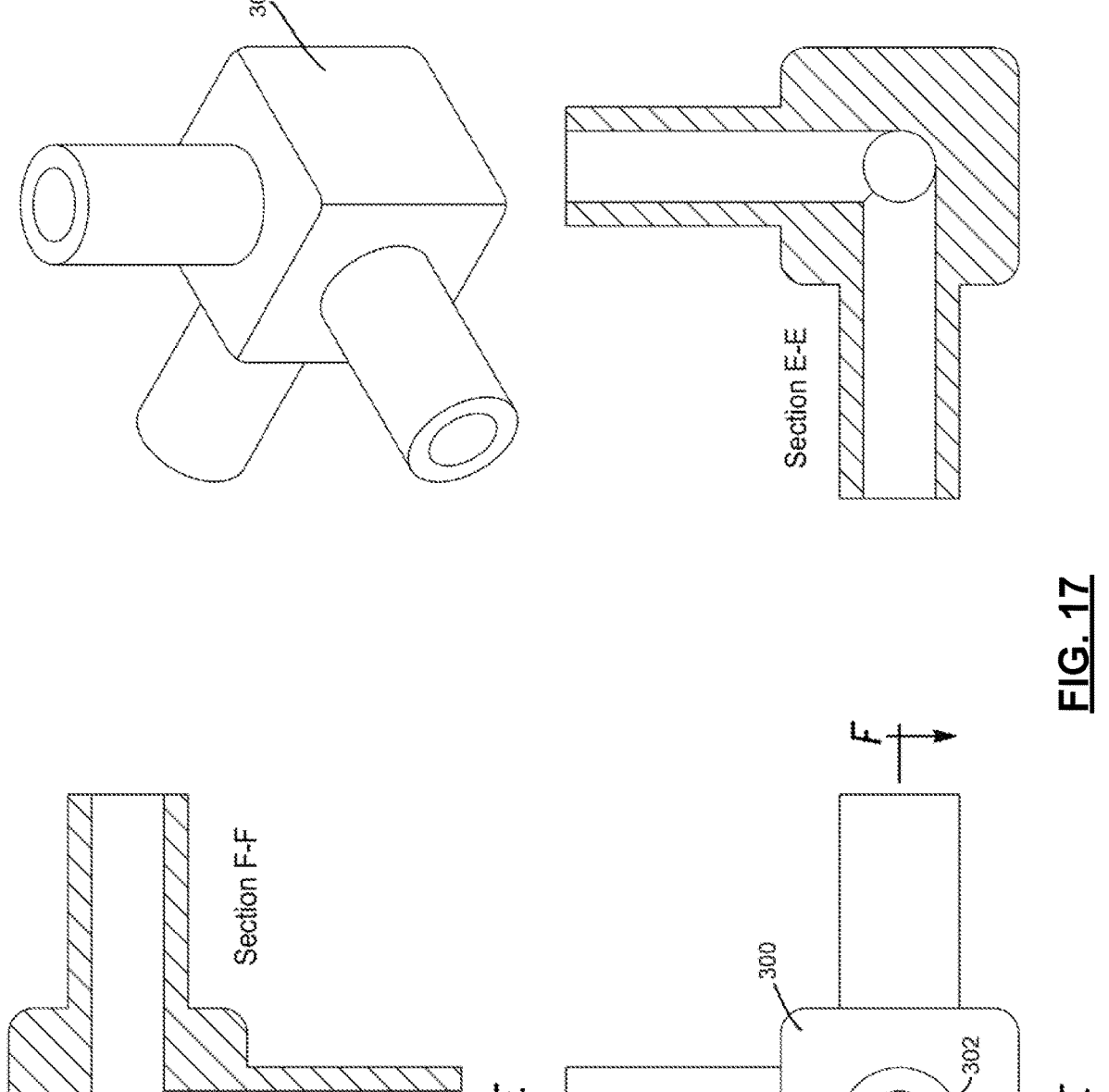
FIG. 17 shows details of the structure of another interconnecting assembly.

The gas lines 230 include multiple elements or sections that are interconnected using surface mount assemblies 290, which are shown and described in detail with reference to FIGS. 9 and 13-15 below. Additional interconnecting assemblies 300 used to interconnect elements or sections of the gas lines 230 at corners (where the gas lines 230 make a sharp turn) are shown in FIG. 17.

Figures 8, 9:
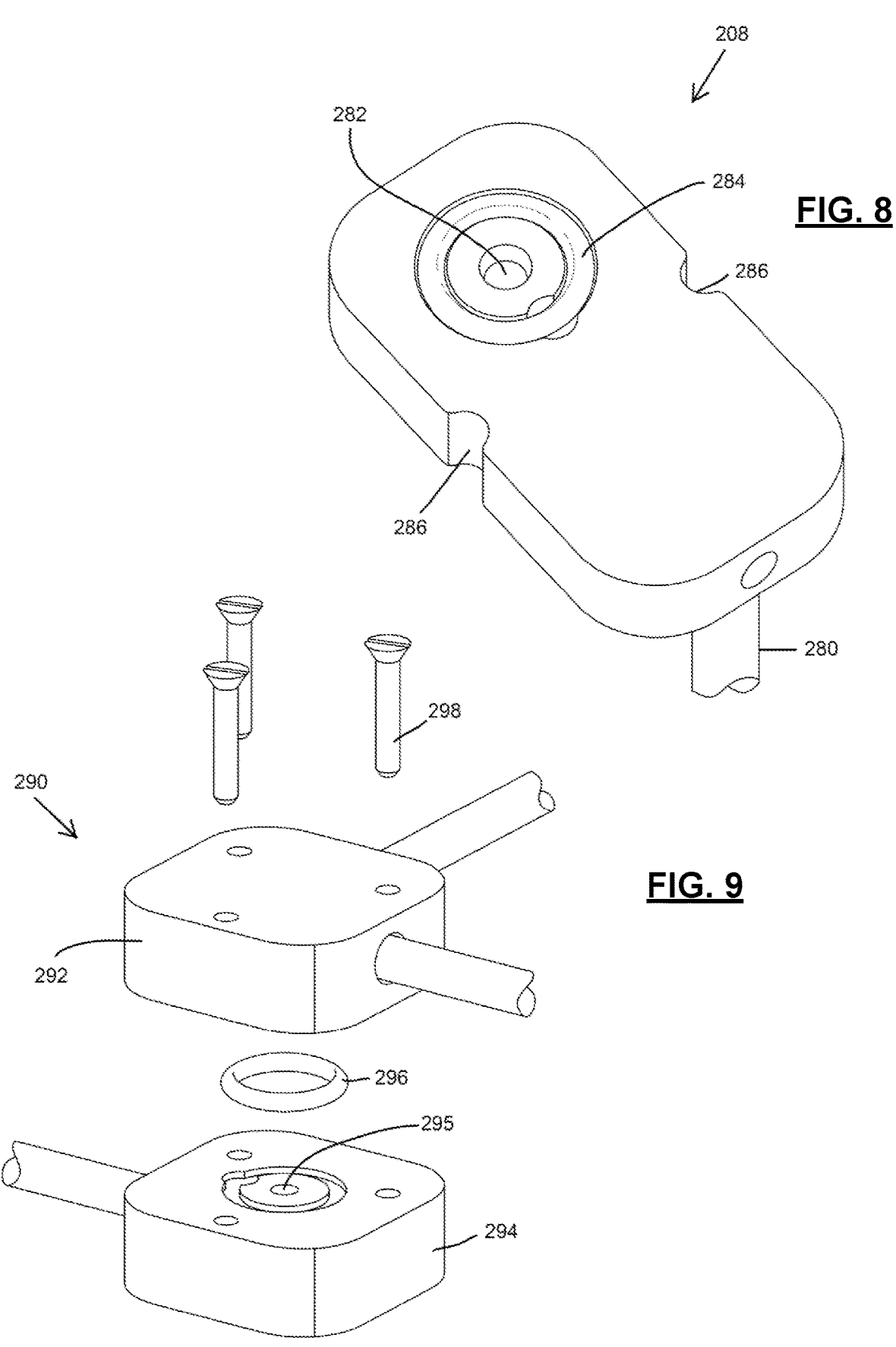
FIG. 8 shows an example of an inlet for liners, which are part of the purging system and the stations shown in FIGS. 2 and 5.
FIG. 9 shows an example of a surface mount assembly used to interconnect a plurality of elements or section of the gas lines.
Figure 16:
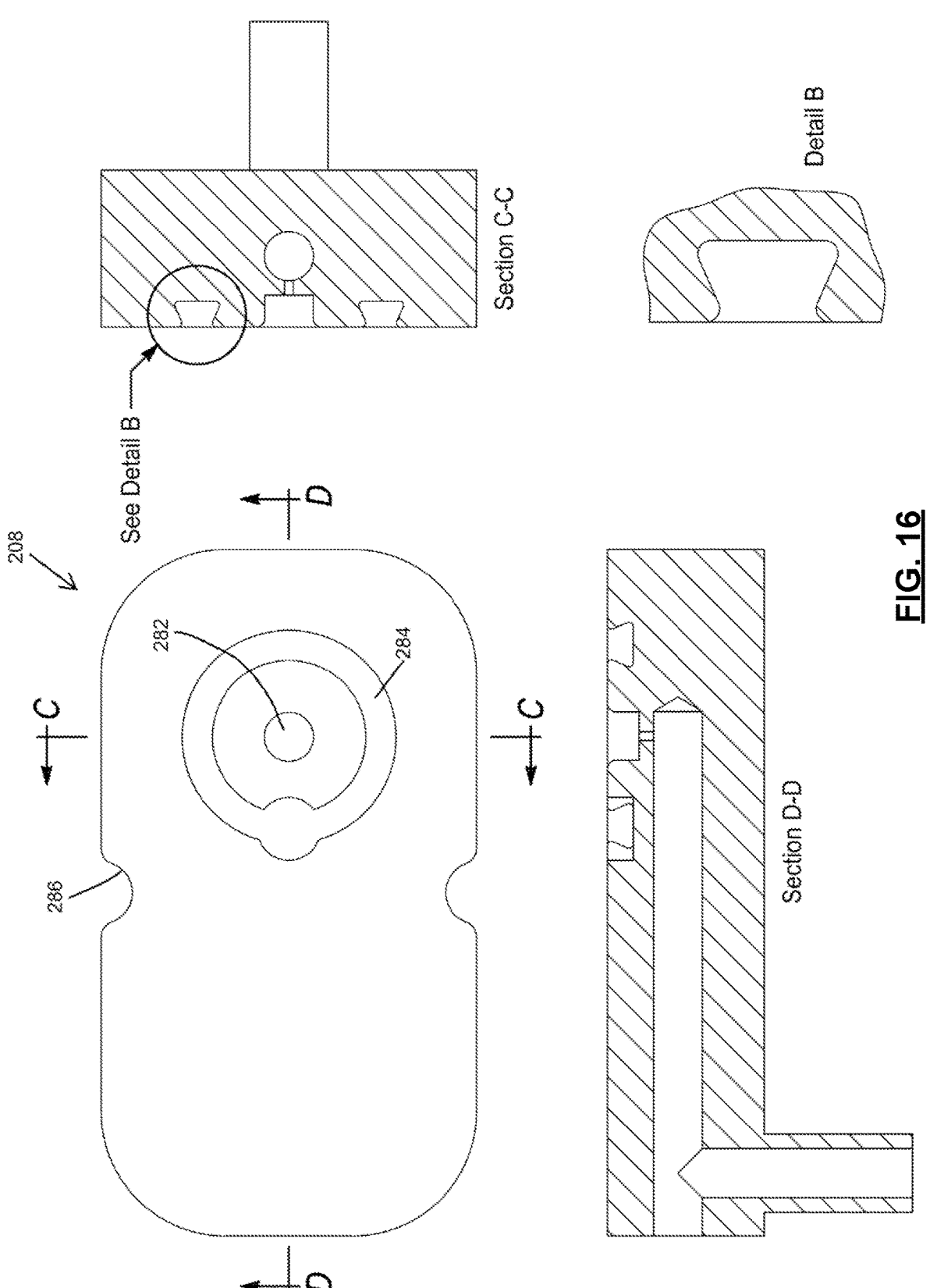
FIG. 16 shows details of the structure of the inlet that supplies the purge gas from the gas lines into the channel in the liners for purging the spindle arms.

FIG. 8 shows an example of the inlet 208 for the liners 206. As described above, each station 202 includes one liner 206 and one inlet 208 for the liner 206. The structure of each inlet 208 is as shown in FIG. 8. The inlet 208 includes a connection 280 to a portion of the gas line 230 extending vertically upwards from the bottom portion of the gas lines 230. The inlet 208 includes an orifice 282 that is in fluid connection with the channel in the liner 206. The orifice 282 mates with an inlet 209 of the channel 207 shown in FIG. 12. The inlet 208 includes an O-ring 284 that surrounds the orifice 282. The O-ring 284 mates with the liner 206 (i.e., with the inlet 209 of the channel 207) and forms an air-tight seal with the liner 206 (i.e., with the inlet 209 of the channel 207). The inlet 208 includes notches 286 for alignment with the liner 206. Additional views of the inlet 208 are shown in FIG. 16.

FIG. 9 shows an example of the surface mount assembly 290 used to interconnect a plurality of elements or section of the gas lines 230. The surface mount assembly 290 includes an upper portion 292 and a lower portion 294. Each of the upper and lower portions 292, 294 includes a connection to an element or a section of the gas lines 230. Each of the upper and lower portions 292, 294 includes an orifice 295 for fluidly connecting the gas lines 230 connected using the surface mount assembly 290. The upper portion 292 mates (i.e., sealingly connects) with the lower portion 294 through an O-ring 296 that forms an air-tight seal between the upper and lower portions 292, 294.

Figure 15:
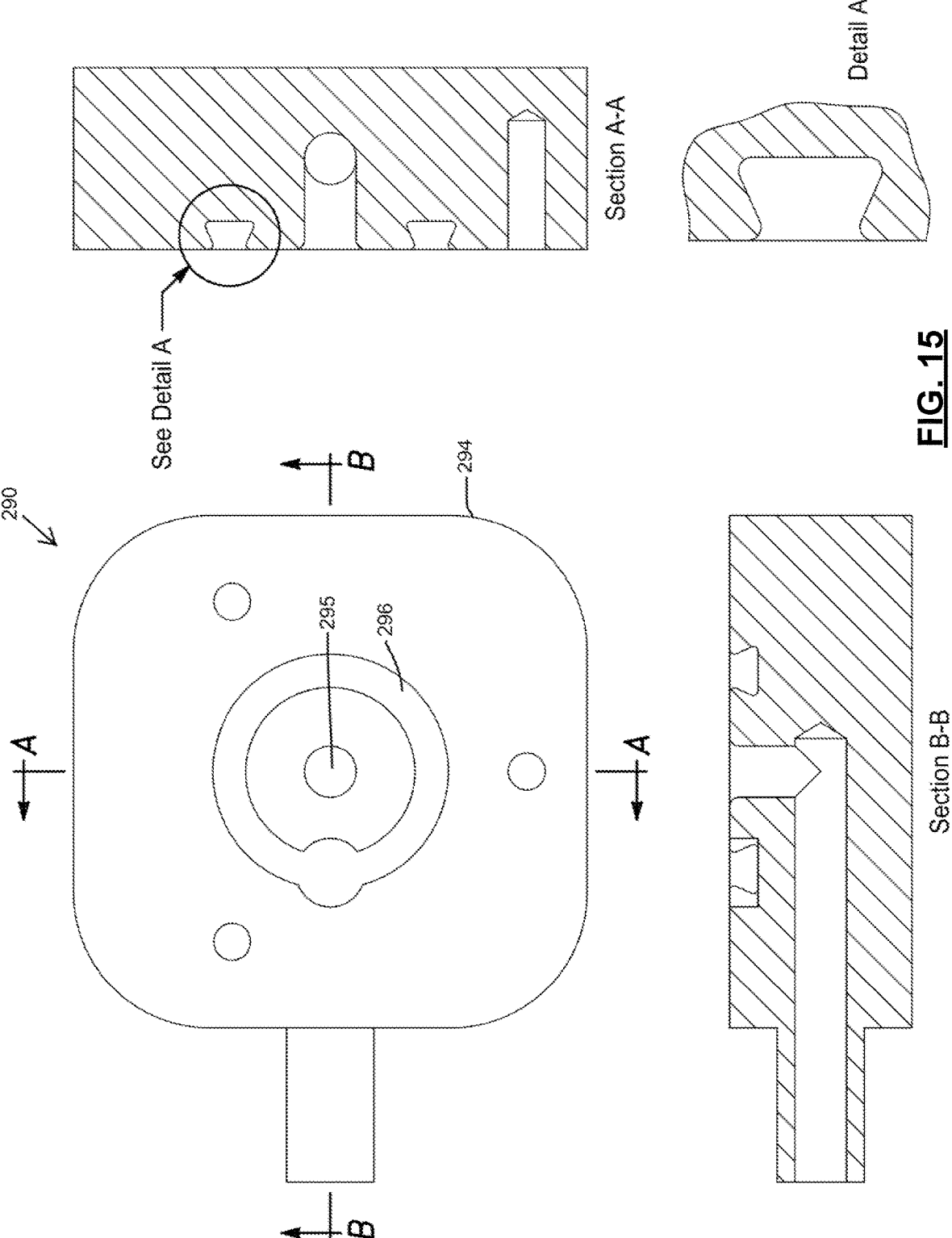
FIG. 15 shows details of the structure of one of the interconnecting assemblies.

Additionally, the upper portion 292 is fastened to the lower portion 294 using a plurality of screws 298. The screws 298 are positioned around the O-ring 296 and surround the O-ring 296. The screws 298 are vented screws to avoid any trapping of the purge gas. In another example of the surface mount assembly 290 that connects the inlet 210 to the gas lines 230, the upper portion 292 includes two connections: a first connection to the inlet 210, and a second connection to an element or a section of the gas lines 230. More views of the surface mount assembly 290 are shown in FIG. 15.

The type of material used for the O-ring 296 can depend on the temperature of the surface mount assembly 290. The temperature of the surface mount assembly 290 can change depending on factors including process temperature, pedestal set point temperature, emissivity of the pedestal, and so on. For example, the O-ring 296 made of a polymer can be used when the temperature of the surface mount assembly 290 can be less than about 300 degrees Celsius, and the O-ring 296 made of a metal or an alloy can be used when the temperature of the surface mount assembly 290 can be greater than about 300 degrees Celsius. The O-ring 284 shown in FIG. 8 can also be made of similar materials as the O-ring 296. However, the O-ring 284 does not heat up as much as the O-ring 296 since heat sinks faster from the O-ring 284 than the O-ring 296.

In use, a controller (e.g., the controller 160 shown in FIG. 1) controls the flow rate of the purge gas being supplied to the gas lines 230 by controlling the valve and the pressure regulator shown at 212 while a wafer is being processed (e.g., using a deposition process) in the stations 202. The purge gas is delivered by the outlets 260 in the liners 206 generally to the spindle arms 204 and more particularly to the contact points 262 of the spindle arms 204. The purge gas prevents or reduces deposition of material, which is being deposited on the wafer, generally on the spindle arms 204 and more particularly on the contact points 262 of the spindle arms 204.

FIGS. 10-17 show additional details and views of the liners 206, the channel 207 in the liners 206, the gas lines 230 and their interconnections including the interconnecting elements 290 and 300, and the inlets 208.

Figure 10:
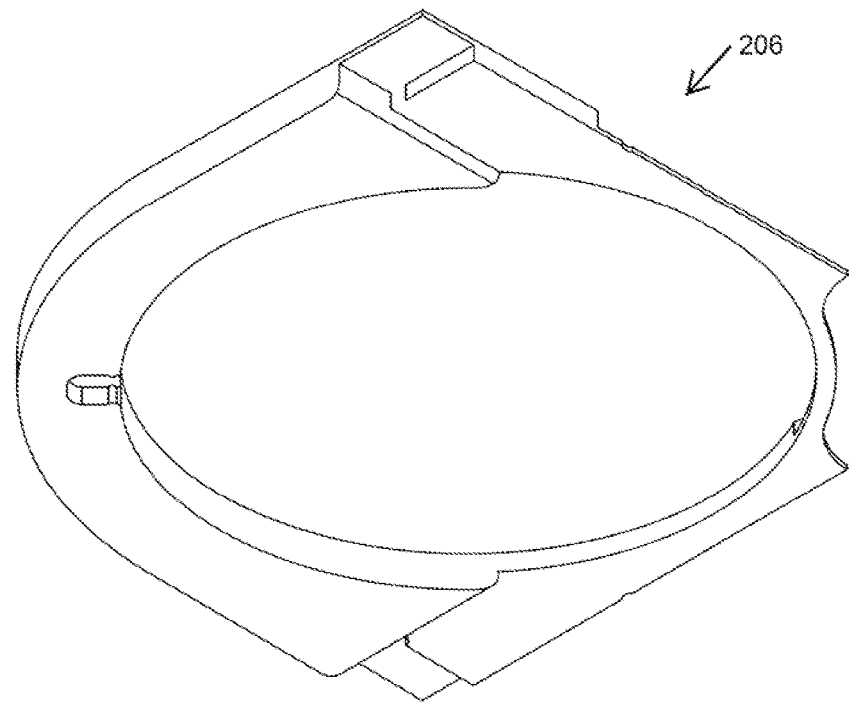
FIG. 10 shows top and bottom views of one of the liners.
Figure 11:
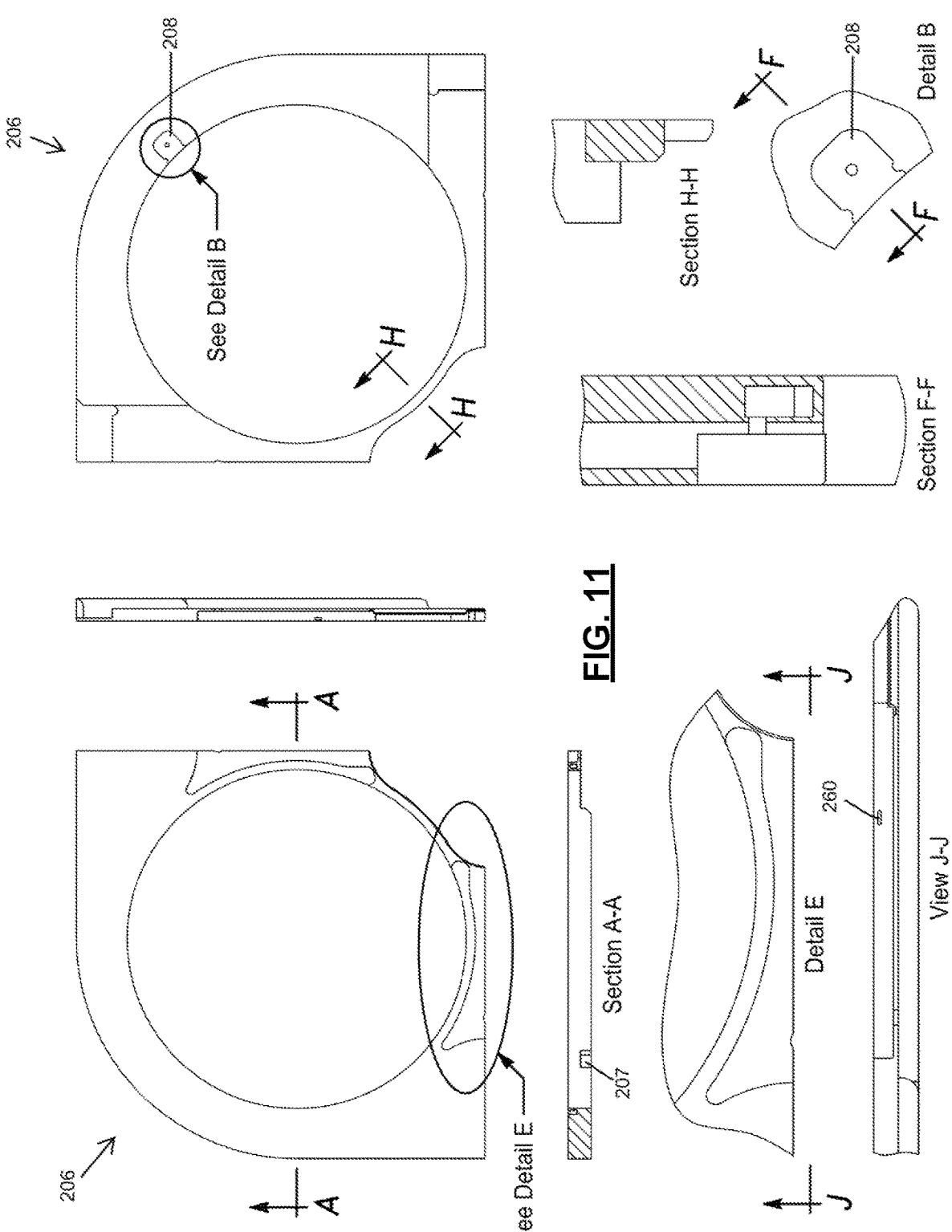
FIG. 11 shows the top and bottom views of one of the liners in further detail.

FIGS. 10-12 show various views and details of the liners 206. FIG. 10 shows top and bottom views of one of the liners 206. Outlets 260 for dispensing the purge gas onto the spindle arms 204 are visible in the top view. FIG. 11 shows the top and bottom views of one of the liners 206 in further detail. The channel 207, which is shown in FIG. 12, is seen in section A-A in FIG. 11. Detail B of the bottom view of the liner 206 in FIG. 11 shows a portion of the inlet 208. As mentioned above, FIG. 12 shows the channel 207 and the inlet 209 into the channel 207. The inlet 208 for the liner 206 mates with the inlet 209 of the channel 207 as described above.

Figure 13:
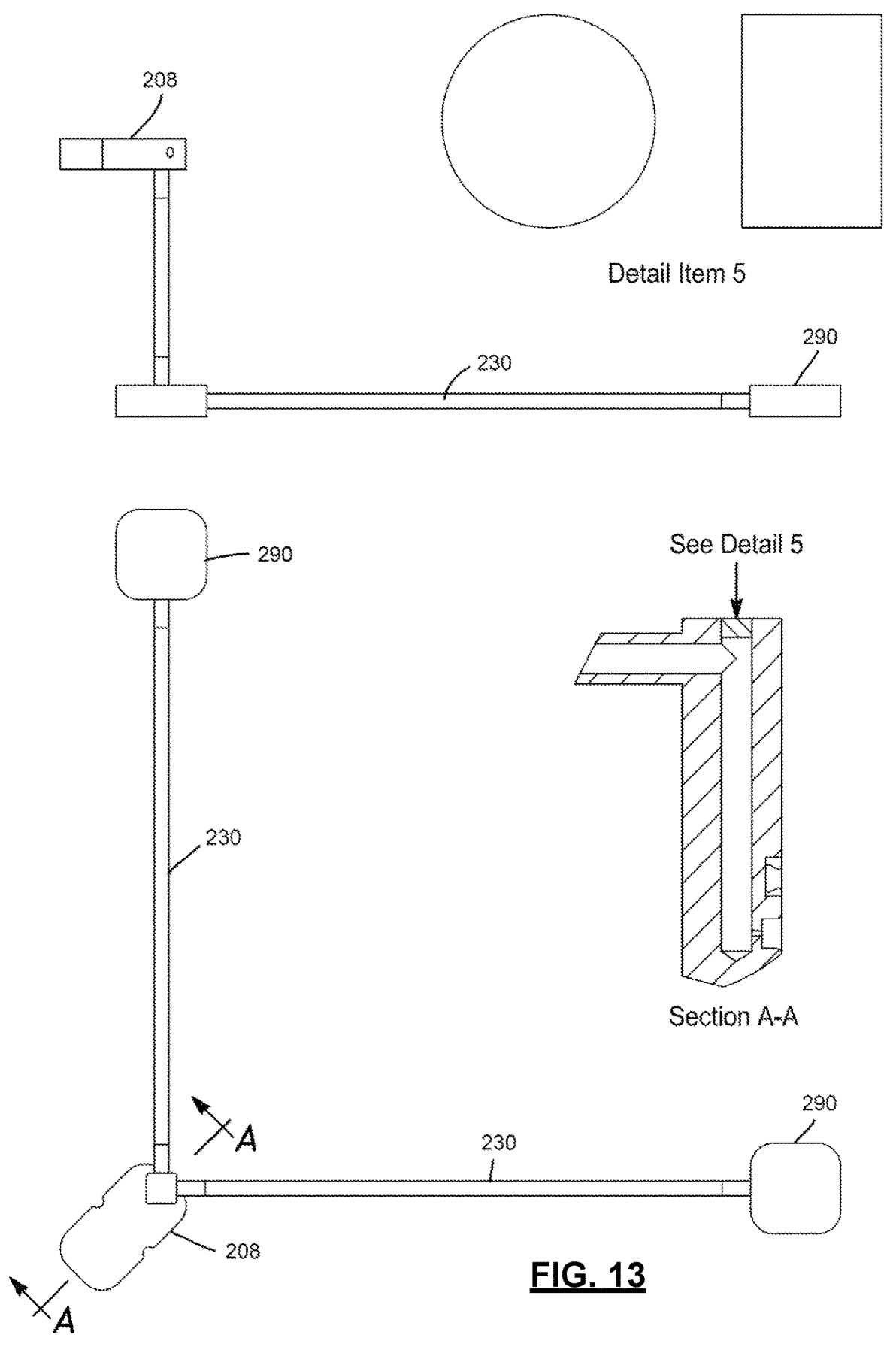
Figure 14:
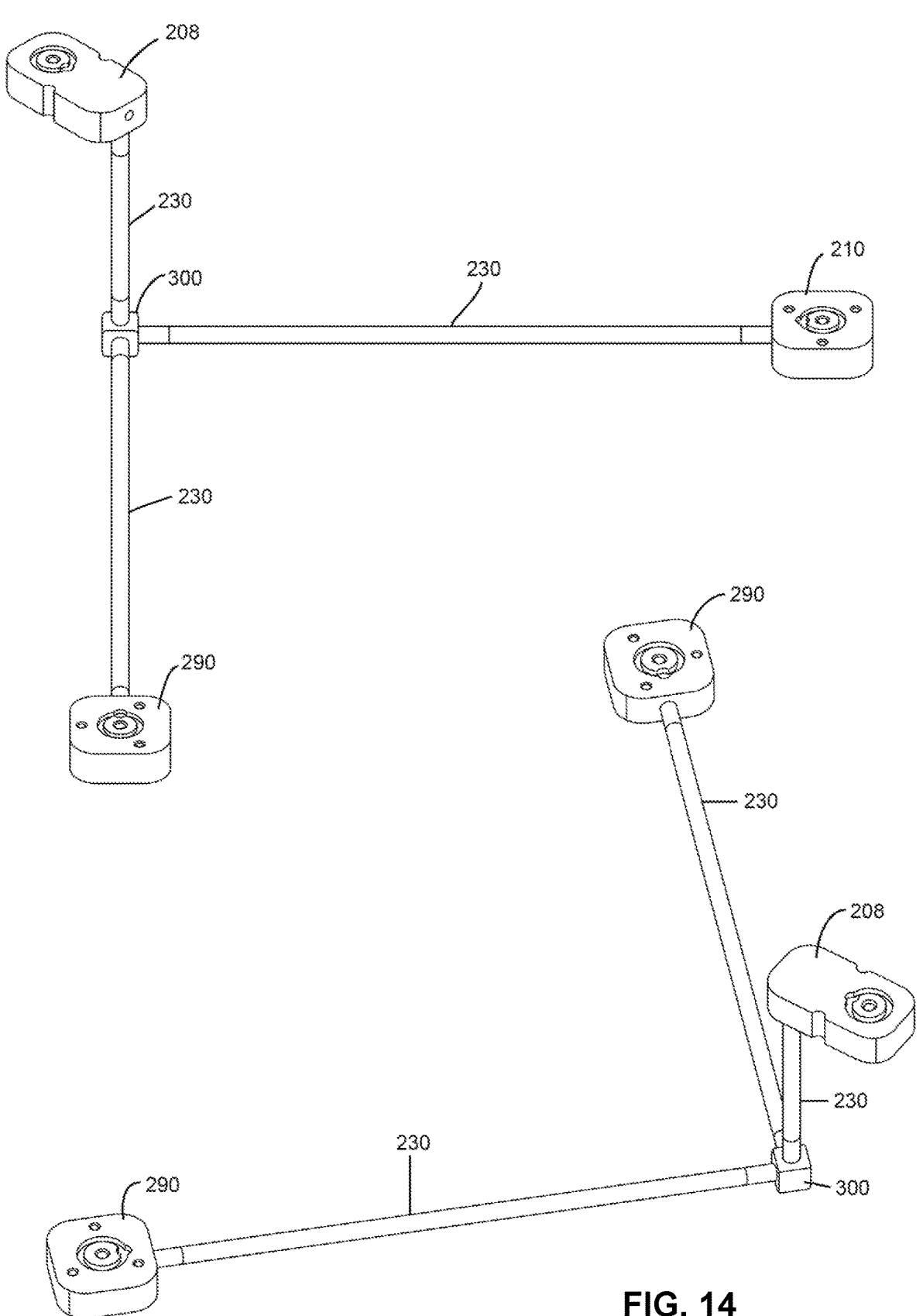

FIGS. 13 and 14 show various elements or sections of the gas lines 230 and their interconnecting assemblies 290 and 300. FIGS. 13 and 14 also show the inlet 210 that receives the purge gas from an external source and the inlet 208 for the liner 206 that supplies the purge gas to the channel 207 in the liner 206 as described above.

FIG. 15 shows the details of the structure of the interconnecting assembly 290, which is also shown in FIG. 7. FIG. 16 shows the details of the structure of the inlet 208, which is also shown in FIG. 8. FIG. 17 shows the details of the structure of the interconnecting assembly 300, which is also shown in FIG. 7. The interconnecting assembly 300 includes an orifice 300 for fluidly connecting the gas lines 230 connected using the interconnecting assembly 300.

Figure 18:
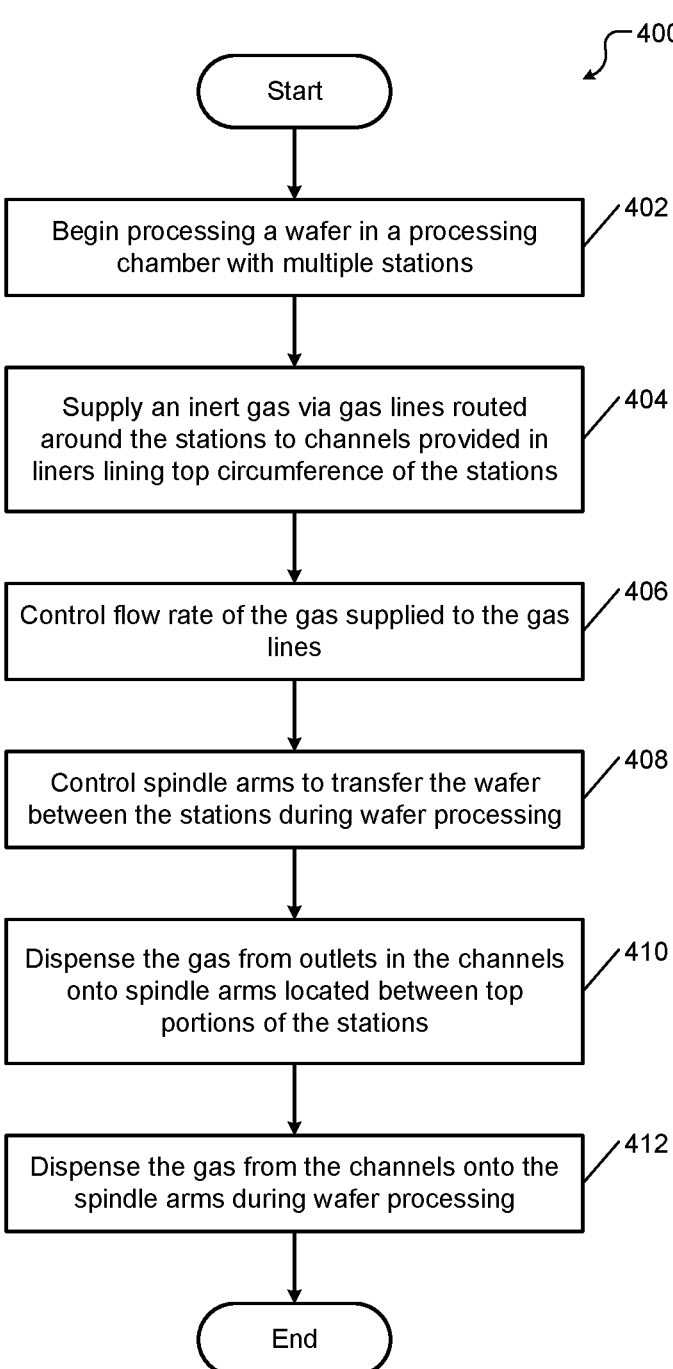
FIG. 18 shows a flowchart of a method for purging the spindle arms during wafer processing.

FIG. 18 shows a flowchart of a method 400 for purging the spindle arms during wafer processing. For example, the method 400 can be performed by the controller 160 shown in FIG. 1. At 402, the method 400 begins processing a wafer in a processing chamber comprising multiple stations and further comprising spindle arms to transfer the wafer between the stations during the processing. At 404, the method 400 supplies an inert gas via gas lines routed around the stations to channels provided in liners lining the top circumference of the stations. At 406, the method 400 controls the flow rate of the inert gas supplied to the gas lines. At 408, the method 400 controls the spindle arms to transfer the wafer between the stations during the wafer processing. At 410, the method 400 dispenses the inert gas from outlets in the channels onto the spindle arms located between the top portions of the stations. At 412, the method 400 dispenses the inert gas from the channels onto the spindle arms during the wafer processing to prevent material from being deposited on the spindle arms during the wafer processing.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system comprising:

a plurality of spindle arms located above a plurality of stations in a processing chamber to transport a semiconductor substrate between the stations, wherein the spindle arms reside in the processing chamber while processing the semiconductor substrate;

first gas lines arranged below the stations to supply a purge gas; and second gas lines extending upwards from the first gas lines to supply the purge gas to the spindle arms while processing the semiconductor substrate in the processing chamber; and a channel arranged near a top portion of each of the stations, the channel being in fluid communication with one of the second gas lines and including an outlet to supply the purge gas to one of the spindle arms.

2. The system of claim 1, further comprising a connecting assembly to connect the channel to the one of the second gas lines.

3. The system of claim 2, wherein the connecting assembly comprises an orifice to control flow of the purge gas into the channel.

4. The system of claim 1, further comprising a liner lining the top portion of each of the stations, the liner comprising the channel.

5. The system of claim 1, wherein the second gas lines are arranged around the stations.

6. The system of claim 1, further comprising a source supplying the purge gas to the first gas lines via a regulator regulating a flow rate of the purge gas to the first gas lines.

7. The system of claim 1, further comprising a controller to:

control a process being performed on the semiconductor substrate;

control the spindle arms during the process to transfer the semiconductor substrate between the stations; and control a flow rate of the purge gas being supplied to the first gas lines.

8. The system of claim 1, further comprising a spindle located at a center of the processing chamber to move the spindle arms laterally across the stations arranged around the center.

9. A system comprising:

a plurality of spindle arms located above a plurality of stations in a processing chamber to transport a semiconductor substrate between the stations, wherein the spindle arms reside in the processing chamber while processing the semiconductor substrate;

first gas lines arranged below the stations to supply a purge gas;

second gas lines extending upwards from the first gas lines to supply the purge gas to the spindle arms while processing the semiconductor substrate in the processing chamber; and a channel arranged near a top portion of each of the stations, the channel being in fluid communication with one of the second gas lines and including an outlet near each end of the channel to supply the purge gas to two of the spindle arms located on either side of the channel.

10. A system comprising:

a plurality of gas lines arranged in a plane around base portions of N stations, the N stations being arranged around a center of a processing chamber for processing a semiconductor substrate, where N is an integer greater than 2;

N liners lining circumferences of top portions of the N stations, respectively, each of the N liners extending from each circumference outwardly parallel to the plane and including a channel in fluid communication with the plurality of gas lines, the channel being arranged along the circumference, having closed first and second ends proximate to the center of the processing chamber, and including an outlet at each of the first and second ends to dispense a gas laterally away from the circumference;

N spindle arms to transfer the semiconductor substrate between the N stations, each of the N spindle arms extending laterally from a spindle at the center of the processing chamber parallel to the plane, being disposed between two adjacent ones of the N liners, and including areas that contact the semiconductor substrate during the transfer, the areas being proximate to the outlets of the channels of the two adjacent ones of the N liners; and N vertical gas lines arranged in peripheries of the N stations, respectively, each of the N vertical gas lines being in fluid communication with each of the plurality of gas lines and with each of the channels of the N liners, respectively.

11. The system of claim 10, wherein each of the N vertical gas lines is connected to a corresponding channel through an inlet to a corresponding one of the N liners, the inlet having an orifice in fluid communication with the corresponding channel.

12. The system of claim 11, wherein the inlet includes:

a connection to a corresponding one of the N vertical gas lines;

an O-ring surrounding the orifice of the inlet, the O-ring connecting the orifice to the corresponding channel; and a plurality of notches to align the inlet with the corresponding one of the N liners.

13. The system of claim 10, wherein:

each of the channels includes a plurality of the outlets; and the areas of each of the N spindle arms that contact the semiconductor substrate are proximate to the plurality of the outlets of the channels of the corresponding two adjacent ones of the N liners.

14. The system of claim 10, wherein the plurality of gas lines are interconnected using connecting assemblies, and wherein each of the connecting assemblies includes:

a first portion connected to a first gas line of the plurality of gas lines;

a second portion connected to a second gas line of the plurality of gas lines;

an O-ring connecting the first and second portions; and a plurality of vented screws disposed around the O-ring and fastening the first and second portions, wherein the first and second gas lines are in fluid communication through the first and second portions.

15. The system of claim 10, wherein each of the N vertical gas lines is positioned away from a vertical travel path of the semiconductor substrate in each of the N stations.

16. The system of claim 10, wherein the plurality of gas lines are connected to a source of the gas located external to the processing chamber, the system further comprising:

a pressure regulator arranged external to the processing chamber to regulate a flow rate of the gas being supplied from the source to the plurality of gas lines.

17. The system of claim 10, wherein the outlets of the channels of the N liners output the gas onto the areas of the N spindle arms during processing of the semiconductor substrate.

18. The system of claim 10, wherein the outlets of the channels of the N liners output the gas onto the areas of the N spindle arms and wherein the gas prevents or reduces deposition of material on the areas of the N spindle arms during processing of the semiconductor substrate.

19. The system of claim 10, further comprising a controller to:

control a process being performed on the semiconductor substrate;

control the N spindle arms during the process to transfer the semiconductor substrate between the N stations; and control a flow rate of a purge gas supplied to the plurality
of gas lines, wherein the outlets of the channels of the N liners output
the gas onto the areas of the N spindle arms to prevent
or reduce deposition of material used in the process on
the areas of the N spindle arms.

* * * * *